US008182009B2

(12) United States Patent
Jamieson et al.

(10) Patent No.: US 8,182,009 B2
(45) Date of Patent: May 22, 2012

(54) END EFFECTOR

(75) Inventors: Jon Jamieson, San Jose, CA (US);
Franco Eng, San Jose, CA (US);
Srinivasan Sundararajan, San Jose, CA (US); Troy Kreger, San Jose, CA (US);
Sasha Belenky, San Jose, CA (US);
Janry Kojangian, San Jose, CA (US)

(73) Assignee: Xyratex Technology, Ltd., Hampshire (GB)

( * ) Notice: Subject to any disclaimer, the term of this patent is extended or adjusted under 35 U.S.C. 154(b) by 508 days.

(21) Appl. No.: 12/402,754

(22) Filed: Mar. 12, 2009

(65) Prior Publication Data

US 2009/0290967 A1 Nov. 26, 2009

Related U.S. Application Data

(60) Provisional application No. 61/036,438, filed on Mar. 13, 2008, provisional application No. 61/098,210, filed on Sep. 18, 2008, provisional application No. 61/122,402, filed on Dec. 14, 2008.

(51) Int. Cl.
*B25J 15/06* (2006.01)

(52) U.S. Cl. ......... 294/183; 294/213; 414/737; 414/941

(58) Field of Classification Search ............ 414/226.01, 414/737, 936, 941, 749.1, 749.5; 294/183, 294/213

See application file for complete search history.

(56) References Cited

U.S. PATENT DOCUMENTS

| | | | | |
|---|---|---|---|---|
| 5,004,399 A | * | 4/1991 | Sullivan et al. | 414/729 |
| 5,292,222 A | * | 3/1994 | Malagrino et al. | 414/815 |
| 5,364,222 A | * | 11/1994 | Akimoto et al. | 414/416.03 |
| 5,711,646 A | * | 1/1998 | Ueda et al. | 414/222.13 |
| 5,950,495 A | * | 9/1999 | Ogawa et al. | 74/490.01 |
| 6,092,971 A | * | 7/2000 | Balg et al. | 414/416.03 |
| 6,132,165 A | * | 10/2000 | Carducci | 414/744.5 |
| 6,991,419 B2 | | 1/2006 | Kim | |
| 7,625,027 B2 | * | 12/2009 | Kiaie et al. | 294/188 |

FOREIGN PATENT DOCUMENTS

| | | |
|---|---|---|
| JP | 11-054589 A | 2/1999 |
| JP | 2003-264215 A | 9/2003 |
| JP | 2006-054455 | 2/2006 |
| JP | 2006-198768 A | 8/2006 |
| KR | 10-2002-032057 A | 7/2004 |

* cited by examiner

*Primary Examiner* — Dean Kramer
(74) *Attorney, Agent, or Firm* — Womble Carlyle Sandridge & Rice LLP

(57) ABSTRACT

An apparatus for transporting a substrate is provided. The apparatus includes an upper portion housing an electric motor, the electric motor having a drive shaft. A motor housing encloses the electric motor. A pivot bracket having a first end and a second end, where the first end of the pivot bracket is coupled to the drive shaft. The apparatus includes a lower portion having a top surface affixed to the second end of the pivot bracket. The lower portion includes a plurality of paddle assemblies each having support extensions extending though a bearing assembly of the lower portion. Each of the paddle assemblies has an independent drive assembly disposed between corresponding support extensions, wherein the lower portion translates between a vertical and horizontal orientation by pivoting around an axis of the driveshaft.

20 Claims, 16 Drawing Sheets

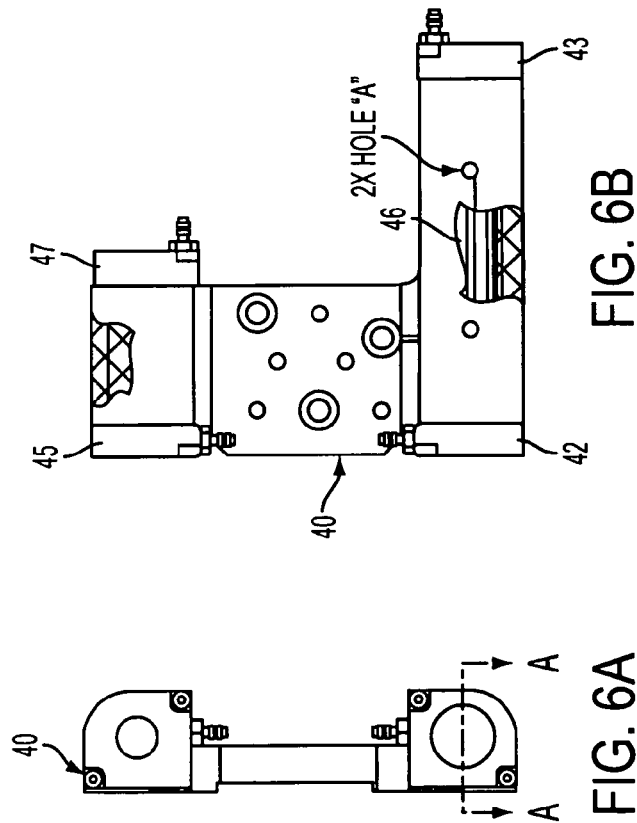
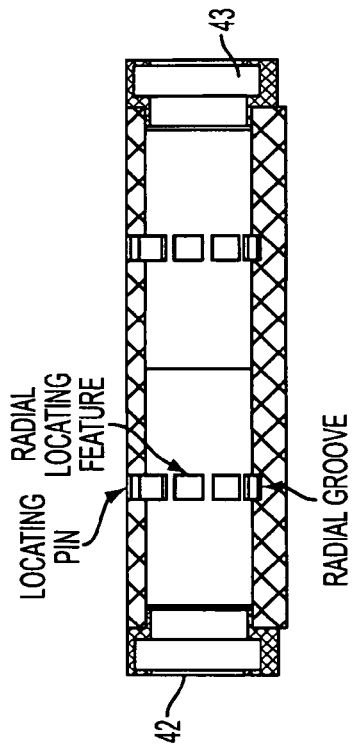
FIG. 6A
FIG. 6B
FIG. 6C
FIG. 6D

END EFFECTOR

CLAIM OF PRIORITY

This application claims priority from U.S. provisional application Nos. 61/036,438, filed on Mar. 13, 2008, and entitled "SERVO ACTUATED END EFFECTOR", 61/098,210 filed Sep. 18, 2008, and entitled "END EFFECTOR", 61/122,402 filed Dec. 14, 2008, and entitled "END EFFECTOR", each of which are hereby incorporated by reference.

BACKGROUND

In the movement of hard drive disks (HDD) platters or substrates throughout the manufacturing process, savings of a fraction of a second in the transfer/transport time of the HDD can translate to higher throughput, a competitive advantage that can result in monetary gains. For example, where the HDD are tested after certain manufacturing processes, the movement of the HDD to and from the testing station may become a bottleneck. Any improvements in the handling/transfer times results in substantial throughput improvements.

Accordingly, there is a need to provide a tool for hard disk drive manufactures that minimizes or reduces handling/transfer times.

SUMMARY

Broadly speaking, the present invention fills these needs by providing an end effector that reduces transfer time. It should be appreciated that the present invention can be implemented in numerous ways, including as a method or a system. Several inventive embodiments of the present invention are described below.

In one aspect of the invention, an apparatus for transporting a substrate is provided. The apparatus includes an upper portion housing an electric motor, wherein the electric motor having a drive shaft. A motor housing encloses the electric motor. A pivot bracket having a first end and a second end is included, where the first end of the pivot bracket is coupled to the drive shaft. The apparatus includes a lower portion having a top surface affixed to the second end of the pivot bracket. The lower portion includes a plurality of paddle assemblies each having support extensions extending though a bearing assembly of the lower portion. Each of the paddle assemblies has an independent drive assembly disposed between corresponding support extensions, wherein the lower portion translates between a vertical and horizontal orientation by pivoting around an axis of the driveshaft.

In another aspect of the invention, an end effector for transporting substrates is provided. The end effector includes a fixed upper portion housing an electric motor driving a pivotable lower portion. The pivotable lower portion is a affixed to the fixed upper portion. The pivotable lower portion has first and second paddle assemblies extending from a bearing assembly. The first and second paddle assemblies are driven through corresponding magnetically coupled drive shafts. An outer surface of the bearing assembly includes a shock absorbing mechanism that reduces travel speed of corresponding paddle assemblies as the paddle assemblies approach a travel end point. The magnetically coupled drive shafts are linked to corresponding support extensions of the first and second paddle assemblies through a compliant bracket. Each of the corresponding support extensions are hollow and deliver vacuum from an external source to disc paddles of the corresponding paddle assemblies.

In yet another aspect of the invention, an apparatus for transporting a substrate is provided. The apparatus includes a first portion housing an electric motor, wherein the electric motor has a drive shaft. The apparatus includes a pivot bracket having a first end and a second end, wherein the first end of the pivot bracket is coupled to the drive shaft. The apparatus includes a second portion affixed to the second end of the pivot bracket. The second portion includes a plurality of paddle assemblies each having support extensions extending through a bearing assembly housed within the second portion. Each of the paddle assemblies have an independent magnetically coupled drive assembly disposed between corresponding support extensions. Each magnetically coupled drive having a shaft with an external drive body disposed around a portion of the shaft and an internal drive body disposed within an inner cavity of the shaft. The external drive body and the internal drive body include magnets coupling the internal and the external drive bodies in that movement of the internal drive body within the inner cavity causes movement of the external drive body.

Other aspects and advantages of the invention will become apparent from the following detailed description, taken in conjunction with the accompanying drawings, illustrating by way of example the principles of the invention.

BRIEF DESCRIPTION OF THE DRAWINGS

Aspects of the present invention will become apparent from the following detailed description, taken in conjunction with the accompanying drawings, illustrating by way of example the principles of the invention.

FIGS. 6A through 6D illustrate the top assembly housing bearing and bottom assembly housing bearing, respectively, in accordance with one embodiment of the invention.

DETAILED DESCRIPTION

The embodiments described below provide an end effector that enhances the movement of disks or substrates through the manufacturing process. The end effector has the capability of accessing a disk in a vertical or horizontal position and translating the disk to a horizontal or vertical position, respectively. In addition, the embodiments can utilize a servo motor, or stepper motor that incorporates feedback, to rapidly and smoothly transfer the Hard disk drive (HDD) from one planar orientation to another planar orientation while reducing, minimizing or eliminating bounce. Bounce is a common effect when using pneumatic air cylinders for motion control. Bounce can be detrimental in HDD processing as the bounce can result in damage to the HDD. However, previous efforts for attenuating bounce have resulted in slower handling/transfer times. The end effector is also compliant with respect to the extension and retraction mechanism and the electric motor providing the pivoting motion. In addition, the end effector is suitable for clean room environments as particulate contamination is essentially eliminated through the embodiments described herein.

Figure 1A:
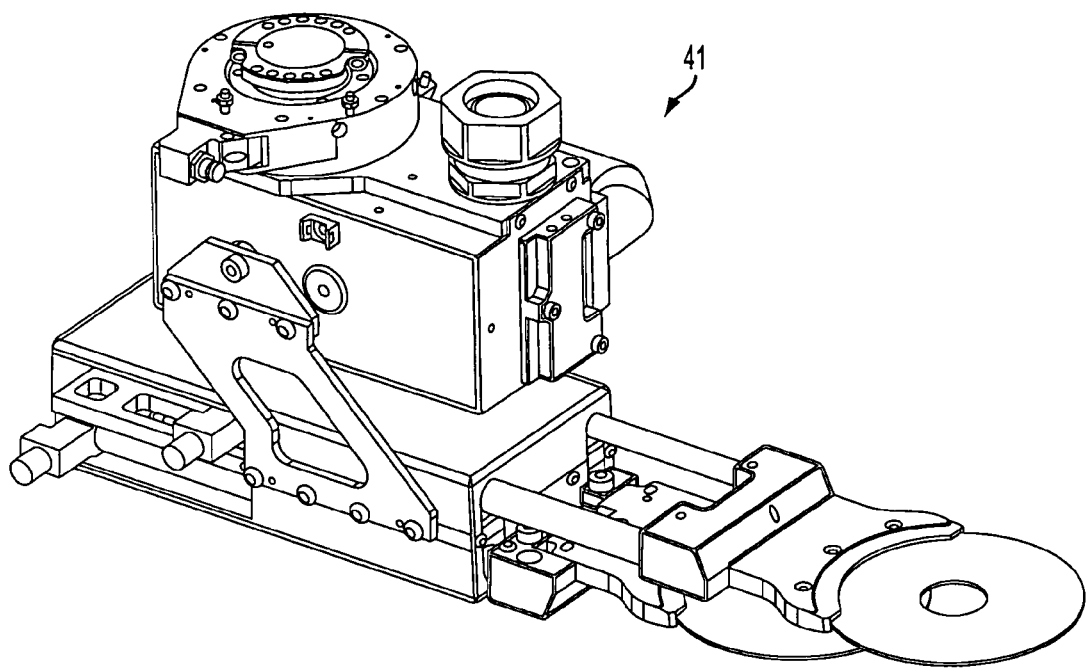
FIGS. 1A and 1B are simplified schematic diagrams illustrating perspective views of the end effector in accordance with one embodiment of the invention.
Figure 1B:
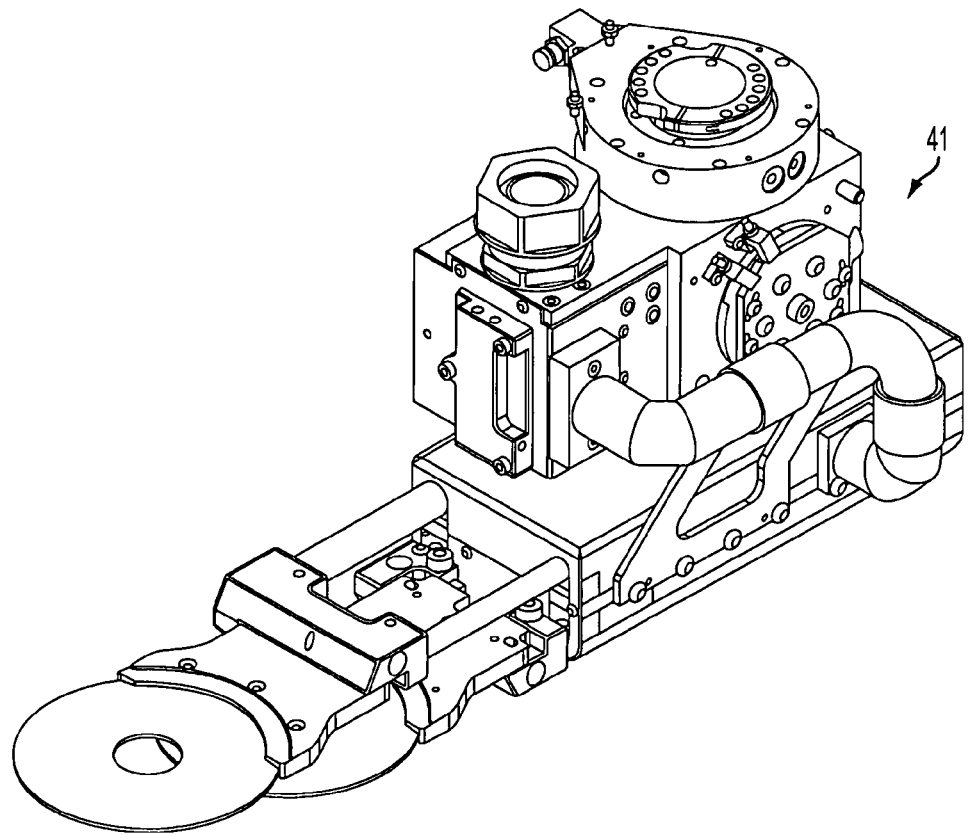

FIGS. 1A and 1B are simplified schematic diagrams illustrating perspective views of the end effector in accordance with one embodiment of the invention. An electric motor, e.g., a servo motor or stepper motor, within a housing disposed on the top portion of the end effector 41 drives the vertical and horizontal positioning of the end effector. Vacuum is provided from a vacuum source so that the paddle assemblies may grasp and hold a substrate, such as a HDD as described in more detail below. In one embodiment, the vacuum is provided through support extensions of the paddle assembly that are driven through a compliant magnetically coupled rod-less cylinder. The top and bottom paddle assemblies can extend and retract as necessary.

Figure 2:
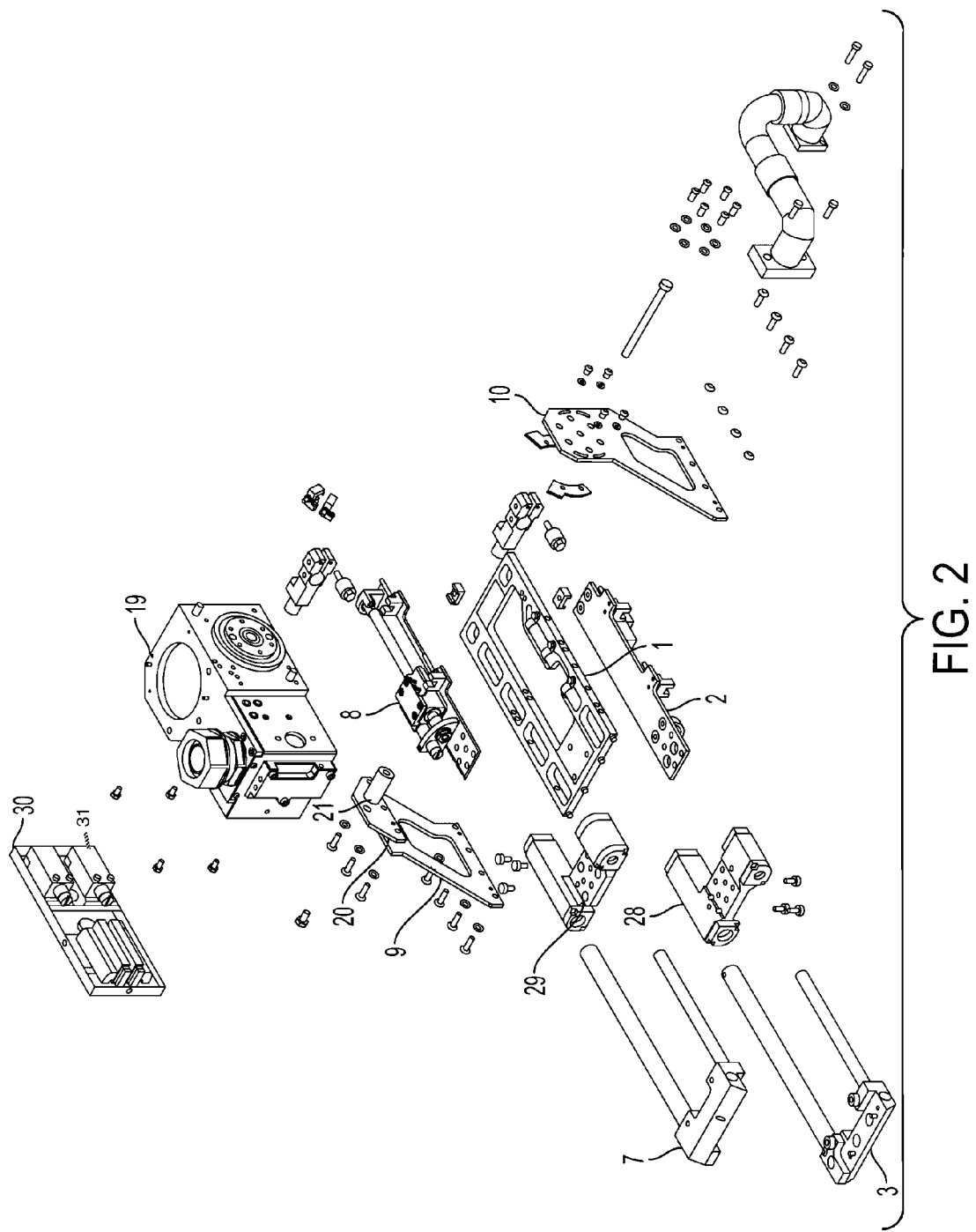
FIG. 2 is a simplified schematic diagram of an end effector assembly and the components consisting of the end effector assembly in accordance with one embodiment of the invention.

FIG. 2 is a simplified schematic diagram of an end effector assembly and the components consisting of the end effector assembly in accordance with one embodiment of the invention. Main plate 1, also referred to as a translation plate, provides support for top actuator assembly 8 and bottom actuator assembly 2. In one embodiment, the actuator assemblies are magnetically coupled actuator assemblies in order to provide the extension retraction for upper paddle assembly 7 and lower paddle assembly 3, respectively. Upper paddle assembly 7 is coupled with actuator assembly 8 through bearing top assembly 29. Similarly, bottom paddle assembly 3 is coupled to actuator assembly 2 through bottom bearing assembly 28. In one embodiment, top assembly bearing 29 and bottom assembly bearing 28 provide scouring so that the corresponding support arms for upper and lower paddle assemblies will not contain any grease that may cause contaminants during the operation and movement of the hard drive disks. Housing 19, which includes motor cover assembly 30, encases or houses a servo motor or stepper motor that drives the pivoting motion to orient the paddle assemblies accordingly. In one embodiment, the servo motor causes the end effector assembly to pivot around pivot post 21, which is affixed to pivot bracket 20 and brackets 10 and 9. In one embodiment, a stepper motor with feedback may be alternately used in place of the servo motor. It should be appreciated that through the embodiments described herein, the servo motor will be able to eliminate the bounce associated with a hard stop thereby saving valuable transfer time that can be compounded over the continuous operation of the unit. An exemplary servo actuator configured to be integrated with the embodiments described herein is a servo actuator from HARMONIC DRIVE LLC. In another embodiment, the entire end effector assembly may be contained within a housing in order to further limit any contamination introduced into the clean room environment. The servo actuator and the stepper motor are compliant in that the motors can error out if something is obstructing the travel path around the pivot point. In one embodiment, a sensor 31 tied into the feedback circuitry for the motor controller can detect the error condition and stop the motor so that the error condition can be corrected. For example a sensor or sensors detecting a certain torque level can initiate an error condition to stop the motor when the torque level is exceeded. The sensor, which is tied into the feedback circuitry for the motor controller, detects the error condition and triggers the motor to stop through communication with the motor controller. The error condition may then be communicated to appropriate personnel so that the condition can be addressed. One skilled in the art will appreciate that any suitable sensor for detecting the error condition may be integrated into the feedback circuitry for the motor controller as the embodiments are not limited to the torque sensor mentioned above.

Figure 3:
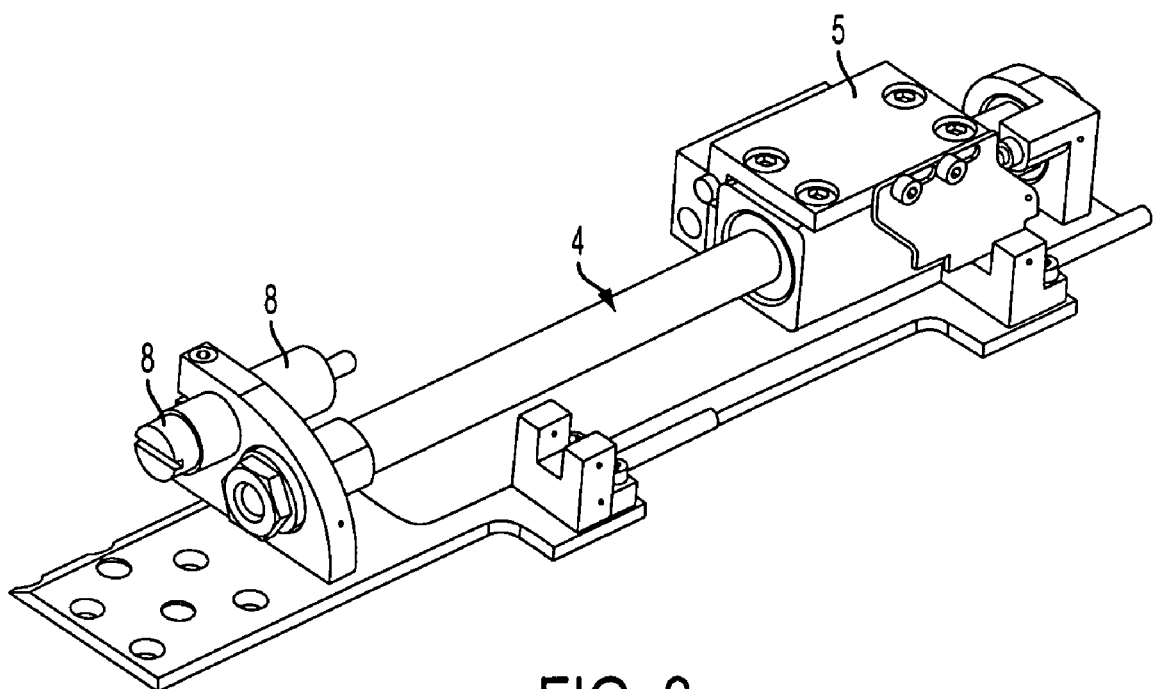
FIG. 3 is a simplified schematic diagram of the top actuator assembly in accordance with one embodiment of the invention.

FIG. 3 is a simplified schematic diagram of the top actuator assembly in accordance with one embodiment of the invention. Top actuator assembly 8 includes a rod-less magnetically coupled cylinder 4 that provides extension and withdrawal of the support assembly for the hard drive disk. In one embodiment, the magnetically coupled drive is any suitable commercially available magnetically coupled drive. Further details on the magnetically coupled drive are provided with reference to FIG. 4. Mounting bracket 5 couples cylinder 4 to a support arm of a corresponding paddle assembly in one embodiment. It should be appreciated that the bottom actuator assembly of FIG. 2 is similar in construction to the top actuator assembly of FIG. 3, with the exception that the bottom actuator assembly is a mirror image of the top actuator assembly.

Figure 4:
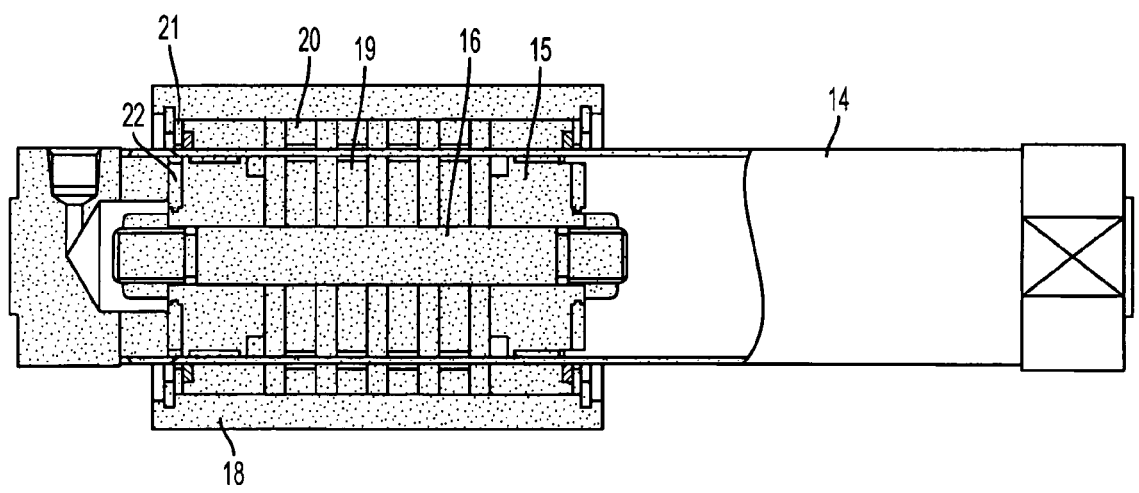
FIG. 4 is a simplified schematic diagram of a rod-less magnetically coupled cylinder in accordance with one embodiment of the invention.

FIG. 4 is a simplified schematic diagram of a rod-less magnetically coupled cylinder in accordance with one embodiment of the invention. Rod-less magnetically coupled cylinder 4 includes cylinder tube 14. Inside cylinder tube 14 is piston 15 and shaft 16. In one embodiment, piston 15 and shaft 16 are driven pneumatically from each end of cylinder tube 14. That is, air may be delivered from an external source to each end depending on the drive direction. The delivery of the air may be directed through a controller for the end effector in one embodiment. Magnets 19 and 20 provide the coupling between the external slider body and piston 15. Cylinder 4 includes spacer 21 and bumper 22. One skilled in the art will appreciate that rod-less magnetically coupled cylinder 4 may be any suitable commercially available unit, such as those available from SMC corporation. Rod-less magnetically coupled cylinder 4 functions to provide compliance for the end effector. That is, if the paddle assembly, or a disc the paddle assembly is carrying, hits something in the travel path as the paddle assembly retracts or extends, magnetically coupled cylinder 4 decouples with magnets 20 of external slide body 18 decoupling from the magnets 19 of piston 15. Thus, upon impact or a certain resistance level experienced, the driving force for the paddle assembly is decoupled magnetically. In one embodiment, external sensors may be utilized to sense an error condition upon the decoupling. In this embodiment, the sensors may be configured to trigger based on the timing between the full retraction and full extension cycles of the paddle assembly. The sensors can then provide an error condition to shut down the end effector, including the servo actuator, and notify appropriate personnel. One skilled in the art will appreciate that a controller for the end effector can monitor the sensors to detect an error condition and that any suitable sensor for detecting the error condition may be integrated into the embodiments as the embodiments are not limited to timing sensors.

Figure 5A:
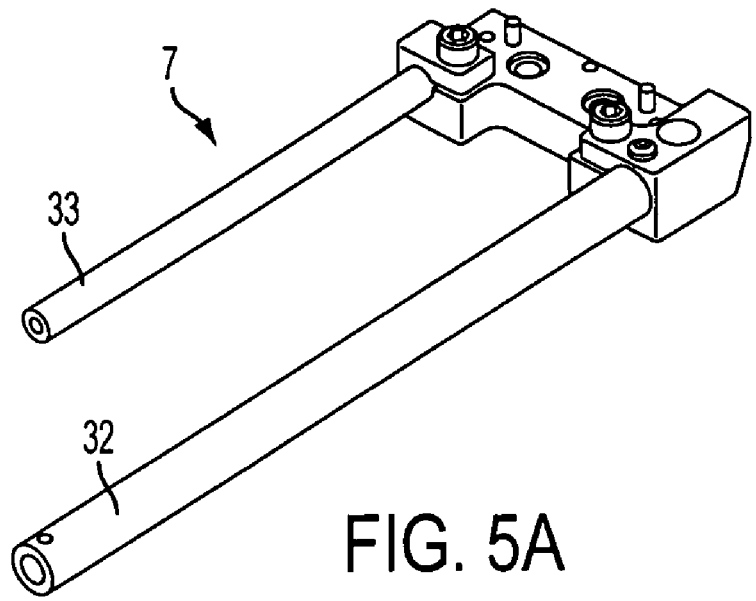
FIGS. 5A and 5B illustrate further details of the upper paddle assembly and lower paddle assembly in accordance with one embodiment of the invention.
Figure 5B:
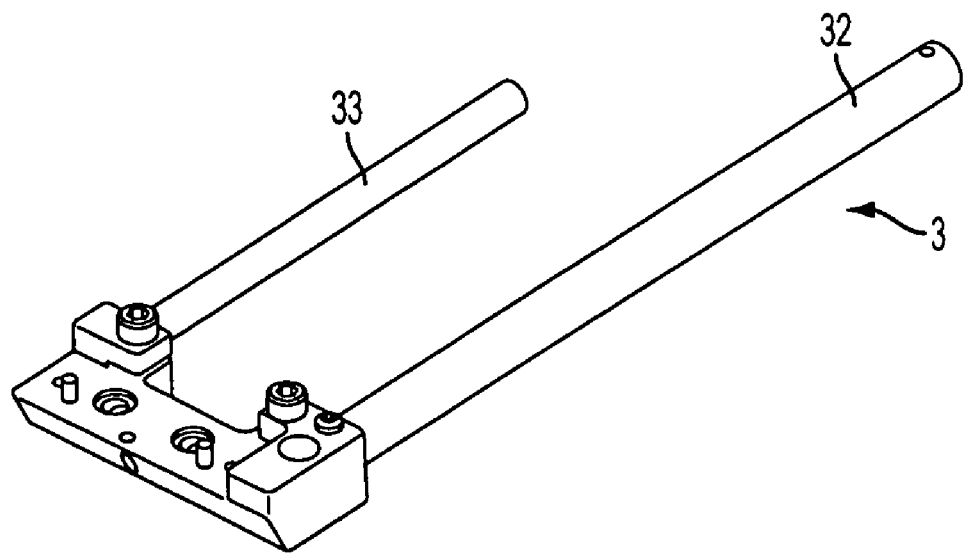

FIGS. 5A and 5B illustrate further details of the upper paddle assembly and lower paddle assembly in accordance with one embodiment of the invention. Upper paddle assembly 7 includes linear shafts 32 and 33 (also referred to as arm extensions or support extensions) that are hollow. Through linear shafts 32 and 33, a vacuum may be applied in order to hold a hard drive disk through a support attached to the mounting bracket at one end of the linear shafts. In one embodiment, the support is configured to hold the HDD by a portion of an edge of the HDD. Thus, the vacuum supplied to the edge will provide the means for supporting the HDD as the HDD is transported. It should be appreciated that the upper paddle assembly and lower paddle assembly of FIGS. 5A and 5B, respectively, are mirror images of each other.

FIGS. 6A through 6D illustrate the top assembly housing bearing and bottom assembly housing bearing, respectively, in accordance with one embodiment of the invention. As illustrated in FIGS. 6A through 6D, the housing assemblies provide scouring in one embodiment in order to prevent any grease from being exposed to an external environment. FIGS. 6A and 6B are side views of the bearing assembly, while FIG. 6C is a top view. FIG. 6D is a cross sectional view along line AA of FIG. 6A. The scouring is provided through scavenge adaptors 42, 43, 45, and 47. Bearing 46 is disposed within bearing housing 40. It should be appreciated that through the embodiments described herein, the end effector can place or position a substrate from a container of substrates which are vertically oriented and place the substrate onto a tester which has a horizontal orientation for the substrate. In addition, while the embodiments depict vacuum edge gripping of the hard drive disk, it should be appreciated that the embodiments are not limited to this configuration. That is, the embodiments may be applied to obtain or hold the hard drive disks through a center opening of the hard drive disk. Of course, a combination of edge gripping and the use of the center hole of the hard drive disk may be used for support. In addition, while hard drive disks are mentioned herein, it should be noted that the embodiments may be extended to the transport of any suitable semiconductor substrate, any magnetic media, or the transport of other substrates as the embodiments are not limited to magnetic media or semiconductor substrates. It should be noted that while vacuum is applied through extension shafts of the paddle assemblies in order to support the hard drive disk when grabbing the drive from the outer edge, the vacuum may be also applied to the self contained environment of the end effector in order to remove any particulates generated from the movement of the parts.

Figure 7A:
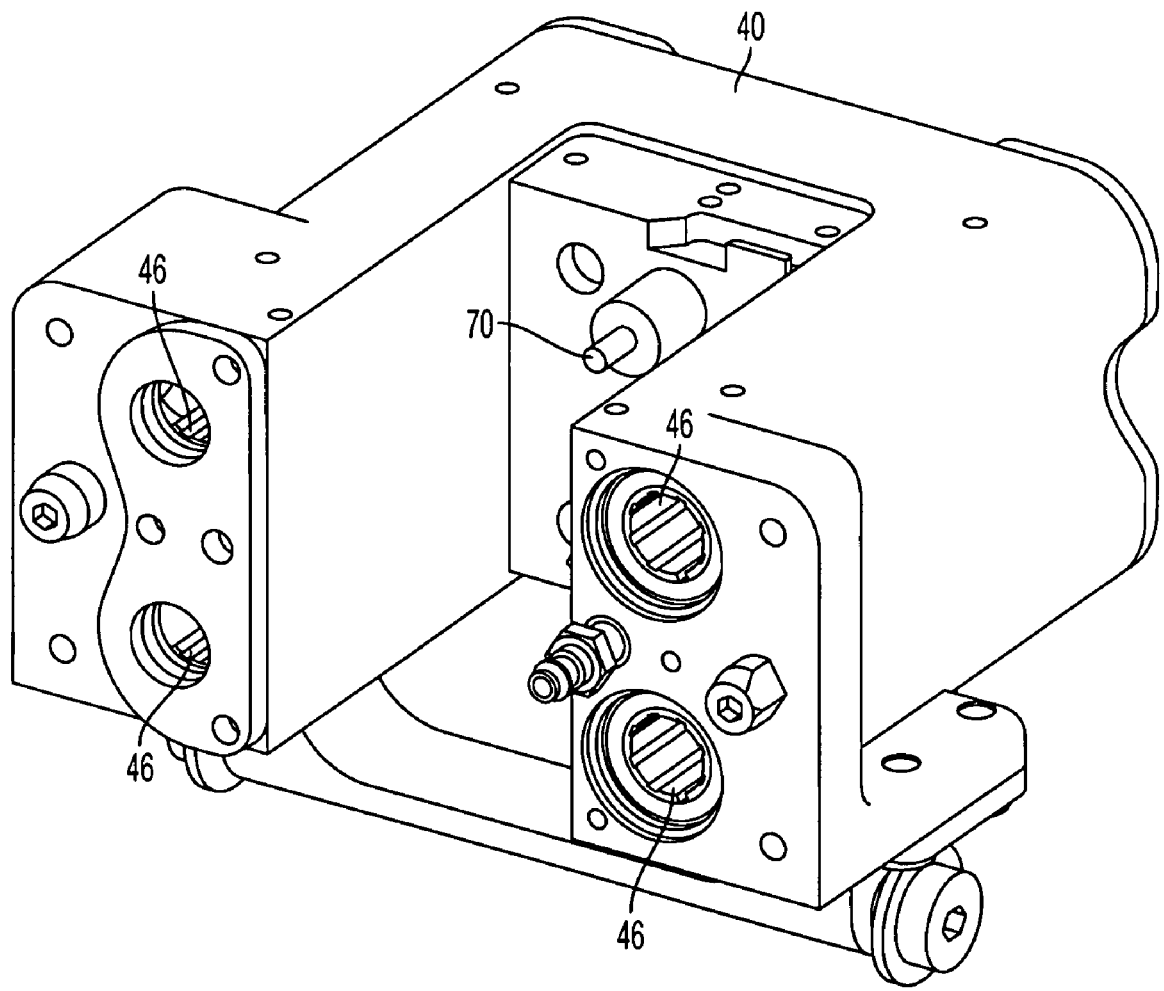
FIGS. 7A and 7B are simplified schematic diagrams of the bearing housing in accordance with one embodiment of the invention.
Figure 7B:
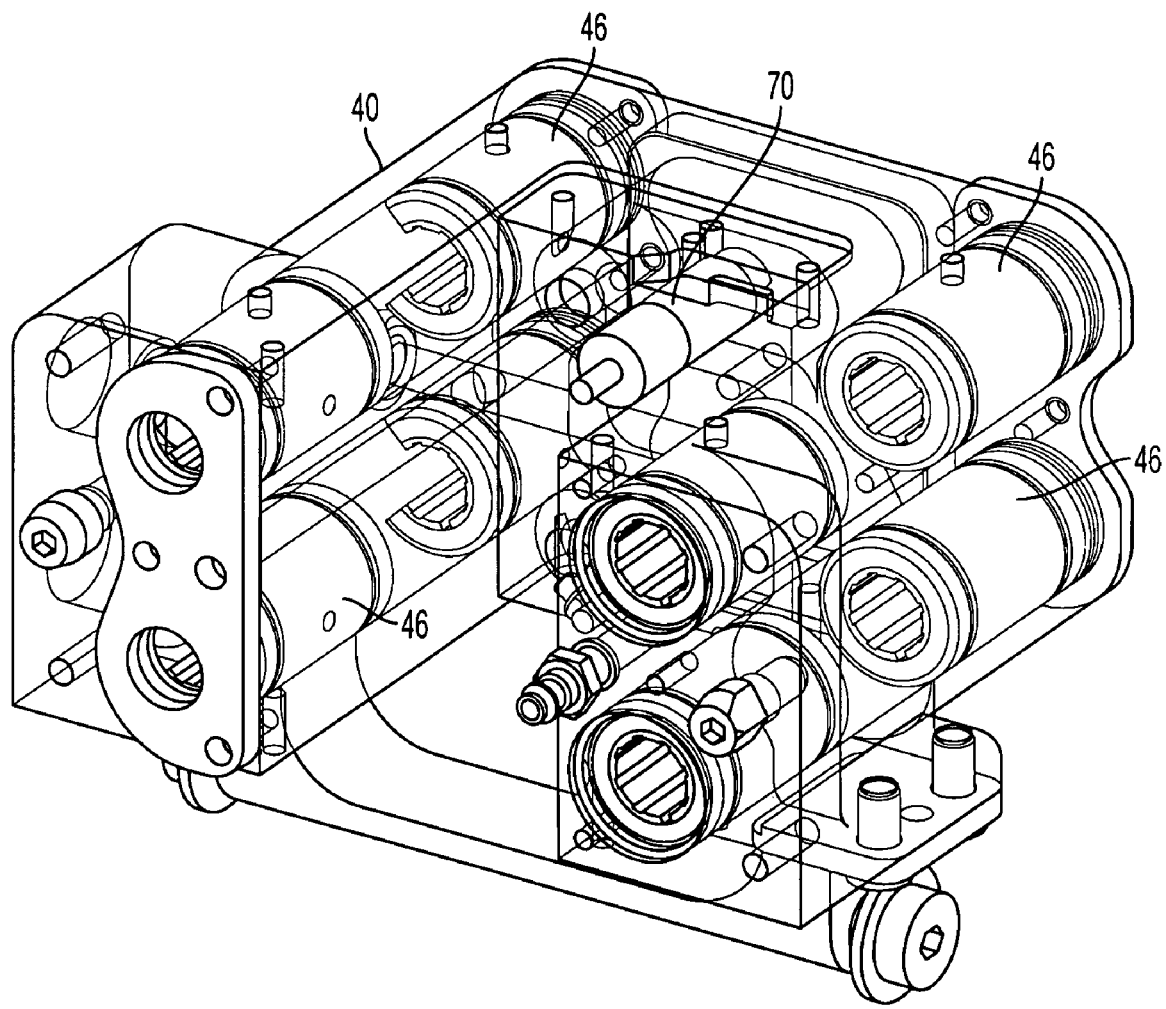

FIGS. 7A and 7B are simplified schematic diagrams of an alternative embodiment for the bearing housing in accordance with one embodiment of the invention. Bearing housing 40 is a monolithic unit in that the top and bottom assemblies are integrated into one unit in this exemplary embodiment. Bearing housing 40 includes bearings 46 to accommodate the extension supports for the paddle assemblies. Shock absorber 70 is integrated into an interior surface of bearing housing 40. Shock absorber 70 functions to controllably stop, e.g., gradually decrease, the travel of the rod-less magnetically coupled cylinder to a full stop. In one embodiment, a spring loaded mechanism may achieve the gradual decrease where the spring tension becomes greater as the pin on the shock absorber is further depressed. FIG. 7B is a similar view to that of FIG. 7A except that the outer covering of bearing housing 40 is transparent in order to view the inner parts of the bearing housing. As illustrated in FIG. 7B, each of the openings include a pair of bearings 46.

Figure 8:
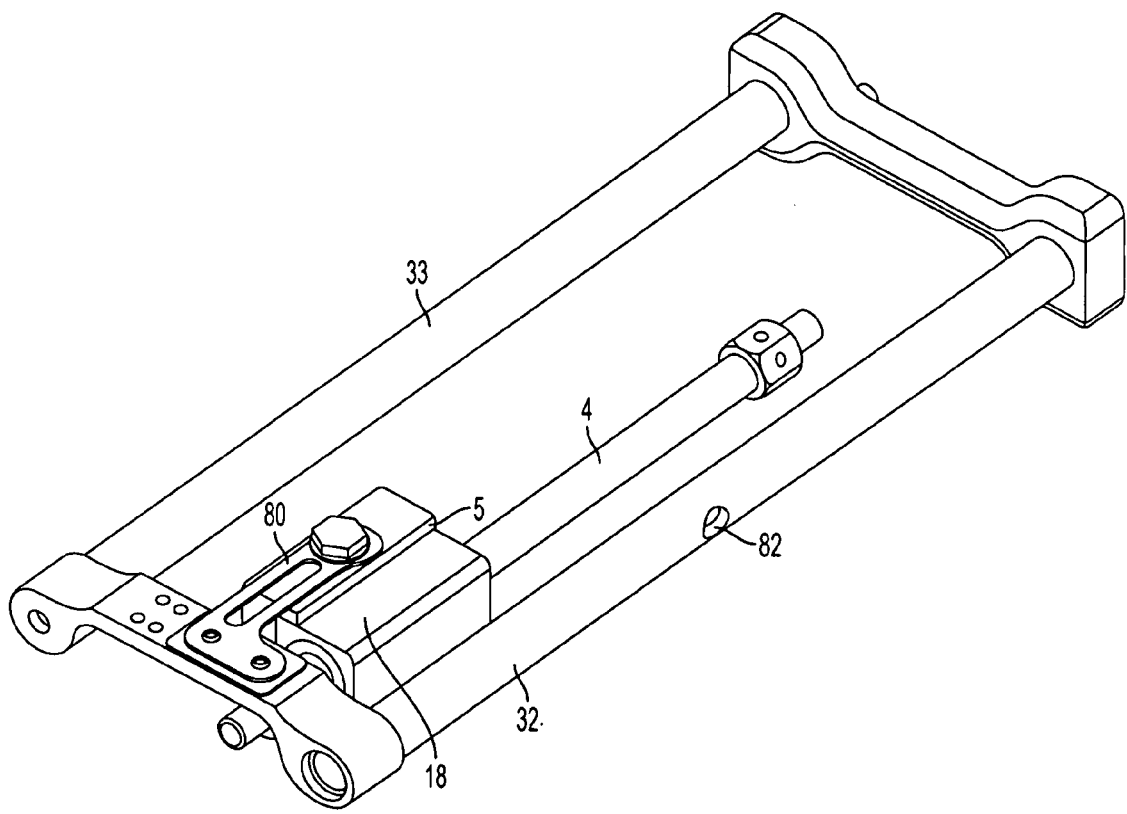
FIG. 8 is a simplified schematic diagram of the paddle assembly in accordance with one embodiment of the invention.

FIG. 8 is a simplified schematic diagram of the paddle assembly in accordance with one embodiment of the invention. The paddle assembly includes arm extensions 32 and 33. Arm extension 32 includes an aperture 82 allowing access to the hollow center of the arm extension, which in turn provides access for vacuum to be delivered to a paddle support for holding a HDD in one embodiment. In one embodiment, the vacuum may be applied through aperture 82 through a covered bearing housing. Rod-less magnetically coupled cylinder 4 drives the paddle assembly, i.e., drives the retraction and extension of the paddle assembly. Mounting bracket 5 is affixed to body cover 18 of rod-less magnetically coupled cylinder 4. Bracket 80 provides the link between the paddle assembly arm extensions and the rod-less magnetically coupled cylinder. In one embodiment, bracket 80 is compliant in that a hole through which the screw affixes the bracket to the external slide body is a slot allowing slight movement of the bracket upon a certain resistance. In another embodiment, the bracket may be relatively thin so that the bracket bends upon experiencing a certain resistance.

Figure 9:
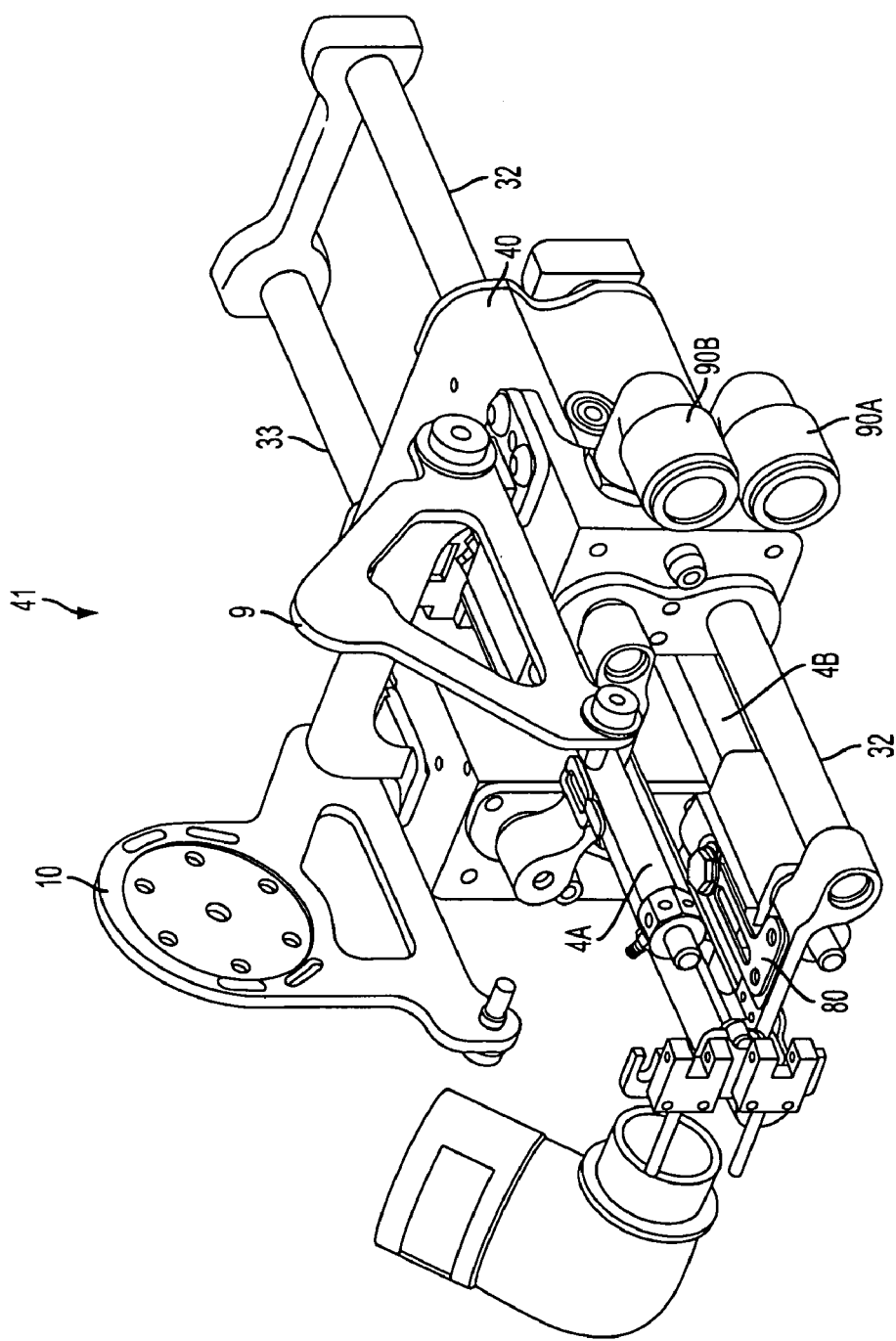
FIG. 9 is a simplified schematic diagram illustrating a perspective view of the end effector with a portion of the housing removed in accordance with one embodiment of the invention.

FIG. 9 is a simplified schematic diagram illustrating a perspective view of the end effector with a portion of the housing removed in accordance with one embodiment of the invention. End effector 41 is illustrated as having top and bottom paddle assemblies, each of which include arm extensions 32 and 33. Bearing housing 40 includes the bearings through which arm extensions 32 and 33 extend. In one embodiment, vacuum from a vacuum source is provided to arm extensions 32 through an aperture in the arm extension via inlets 90A and 90B. Rod-less magnetically coupled cylinders 4A and 4B coupled to top and bottom paddle assemblies, respectively, through bracket 80, provide the drive for extending and retracting the paddle assemblies. Brackets 10 and 9 provide support for the lower body of end effector 41 and are linked to the drive motor in order to pivot the lower body of the end effector as illustrated in FIGS. 11A and 11B.

Figure 10A:
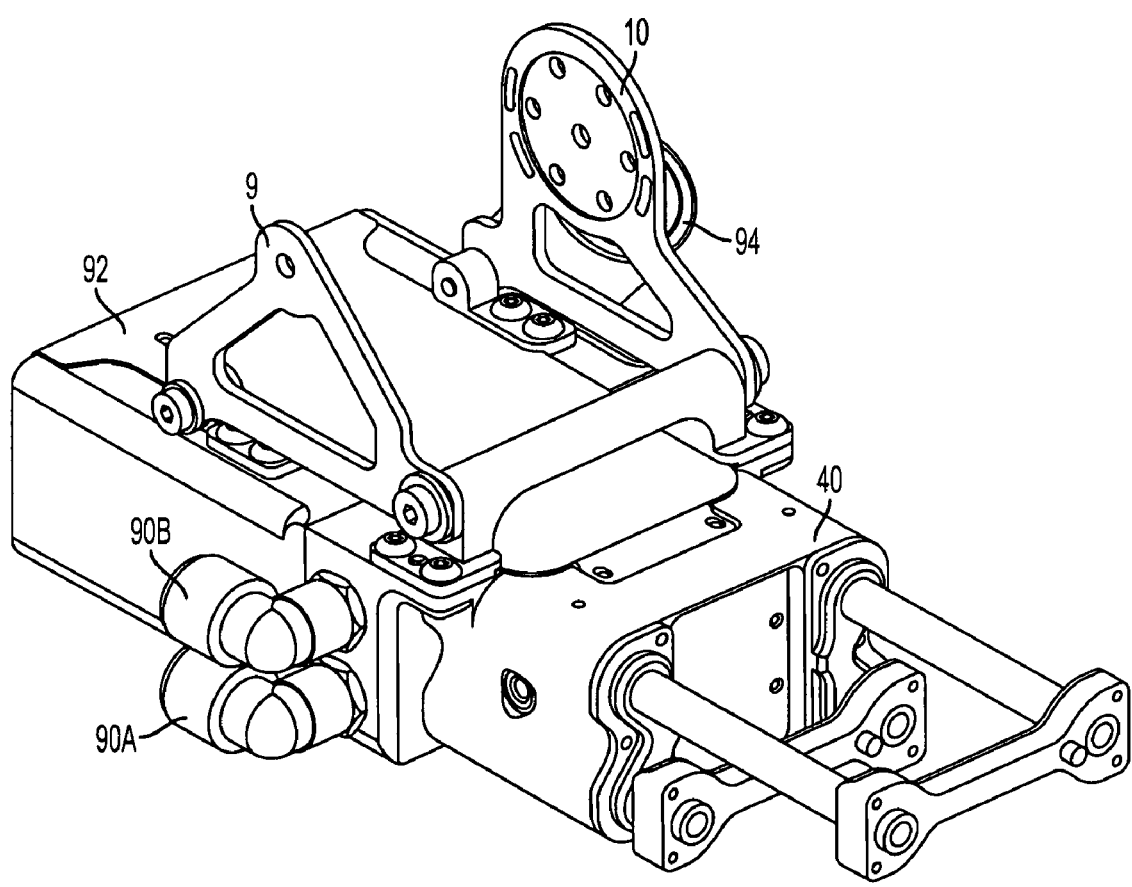
FIGS. 10A and 10B are simplified schematic diagrams illustrating alternative views of the end effector in accordance with one embodiment of the invention.
Figure 10B:
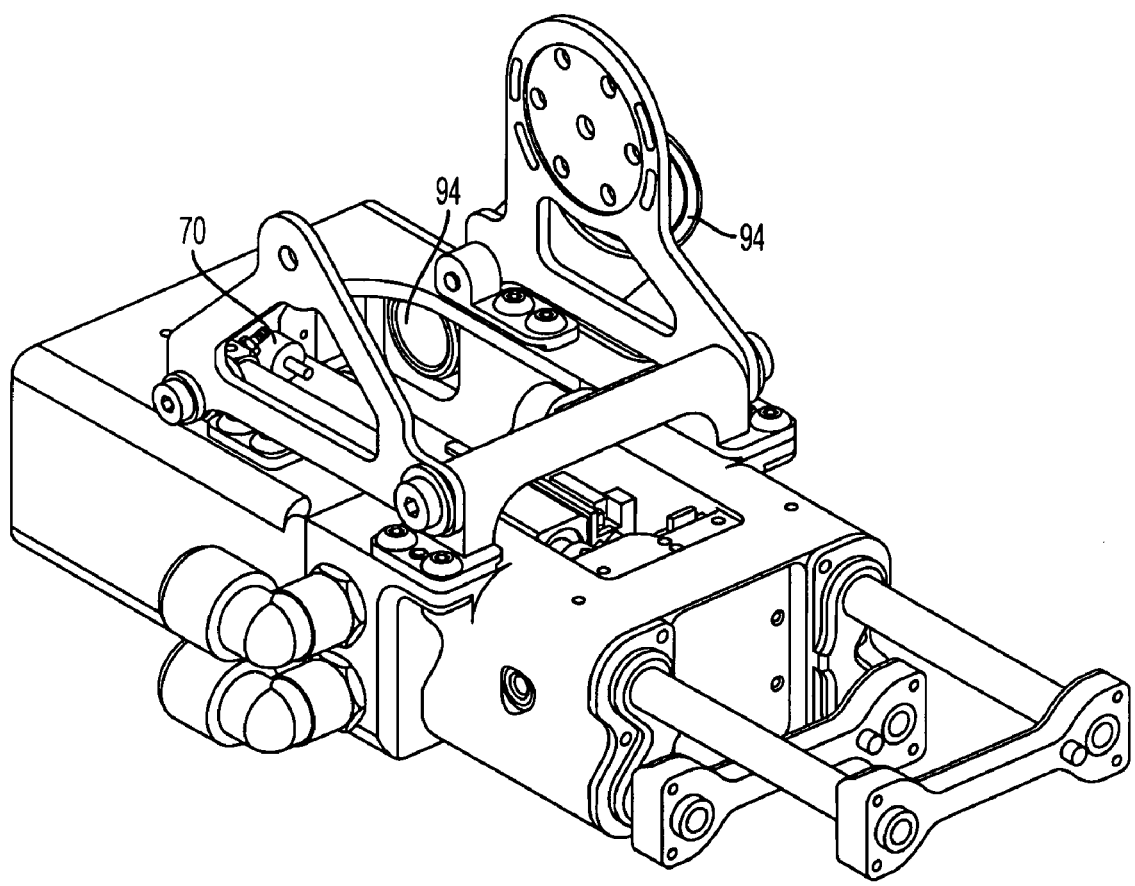

FIGS. 10A and 10B are simplified schematic diagrams illustrating alternative views of the end effector in accordance with one embodiment of the invention. The lower portion of the end effector is illustrated with cover plate 92 intact in FIG. 10A and cover plate 92 partially removed in FIG. 10B. The arm extensions extend through bearing housing 40 with the upper paddle assembly in an extended position and the lower paddle assembly in a retracted position. Conduit 94 is provided the enable a vacuum inlet to the enclosed lower body portion of the end effector to evacuate the area enclosed by the lower body portion cover or keep the enclosed portion at a lower pressure relative to the external environment. One skilled in the art will appreciate that the end effector may be employed in a clean room environment, therefore, containment of particulate contamination is desirable.

Figure 11A:
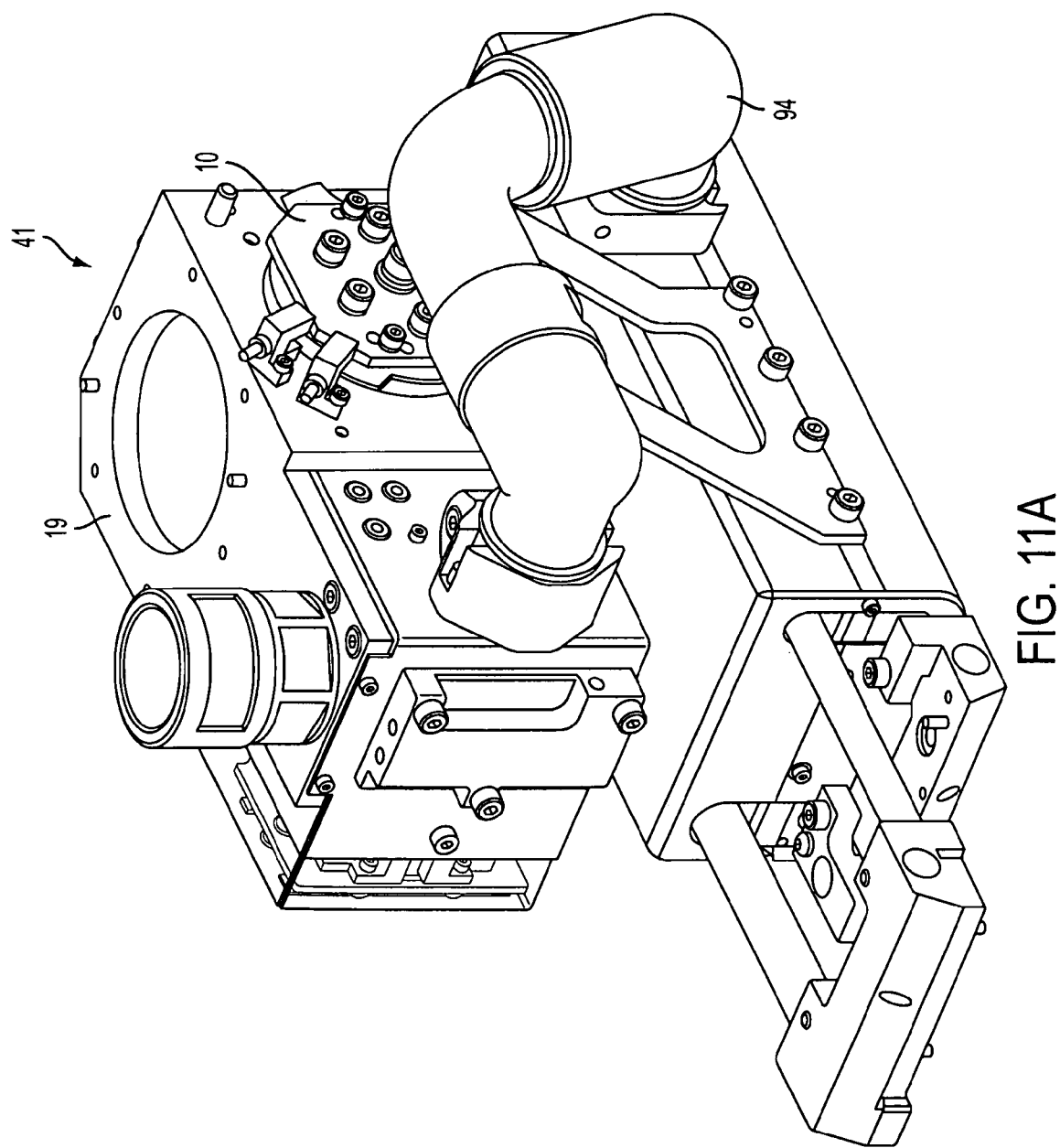
FIGS. 11A and 11B are simplified schematic diagrams illustrating the pivotable orientations of the end effector in accordance with one embodiment of the invention.
Figure 11B:
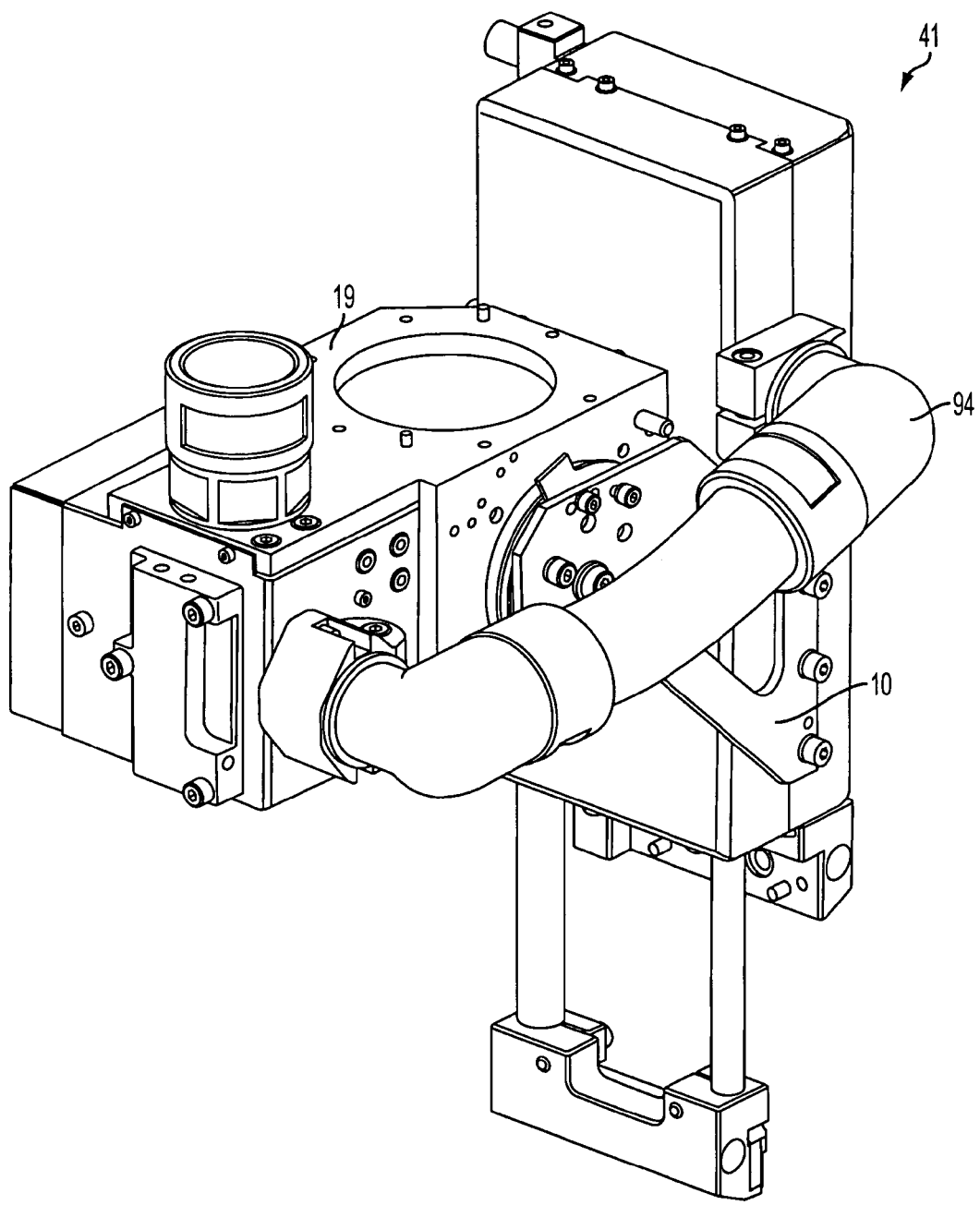

FIGS. 11A and 11B are simplified schematic diagrams illustrating the pivotable orientations of the end effector in accordance with one embodiment of the invention. In FIG. 11A, end effector 41 is illustrated with the lower body portion in a horizontal orientation, while FIG. 11B illustrates the end effector in a vertical orientation. Motor housing 19 houses a servo or stepper motor that drives a pivot shaft attached to bracket 10 and a corresponding bracket, i.e., bracket 9 of FIG. 9. Motor housing 19 includes a servo actuator that provides the movement to translate a disk between vertical and horizontal positions in accordance with one embodiment of the invention. It should be appreciated that a stepper motor having a controller to incorporate feedback may be used in place of servo motor 13. The use of a servo motor or a stepper motor with feedback enables the motor controller to control the transport as opposed to the position of a stop for an air cylinder. In addition, servo motors can control the transport motion, e.g., the acceleration and deceleration between positions so as to eliminate or minimize bounce that would be present within a system using a hard stop of an air cylinder. That is, the motion of the air cylinder is relatively uncontrolled when compared to the feedback-controlled motion offered by a servo motor. Conduit 94 is attached to flexible tubing, which is linked to motor housing 19 to accommodate the pivoting of the lower portion of the end effector. A conduit assembly that includes conduit 94 provides a conduit between motor housing 19 and a housing encapsulating the lower body portion of the end effector. In one embodiment, end effector 41 delivers or retrieves a HDD from to a tester or other device in the horizontal position of FIG. 11A. In the vertical position of FIG. 11B, end effector 41 delivers or retrieves a HDD to a cassette or holder for the HDDs. In one embodiment, the upper portion of the end effector is fixed in that the upper portion does not pivot as illustrated in FIGS. 11A and 11B. It should be appreciated that the end effector may be affixed to a robot that moves the end effector between equipment locations, e.g., between a tester and a cassette holding the substrates in a vertical orientation. The lower portion of the end effector is pivotable around an axis of the drive shaft of the electric motor as illustrated in FIGS. 11A and 11B.

Figure 12A:
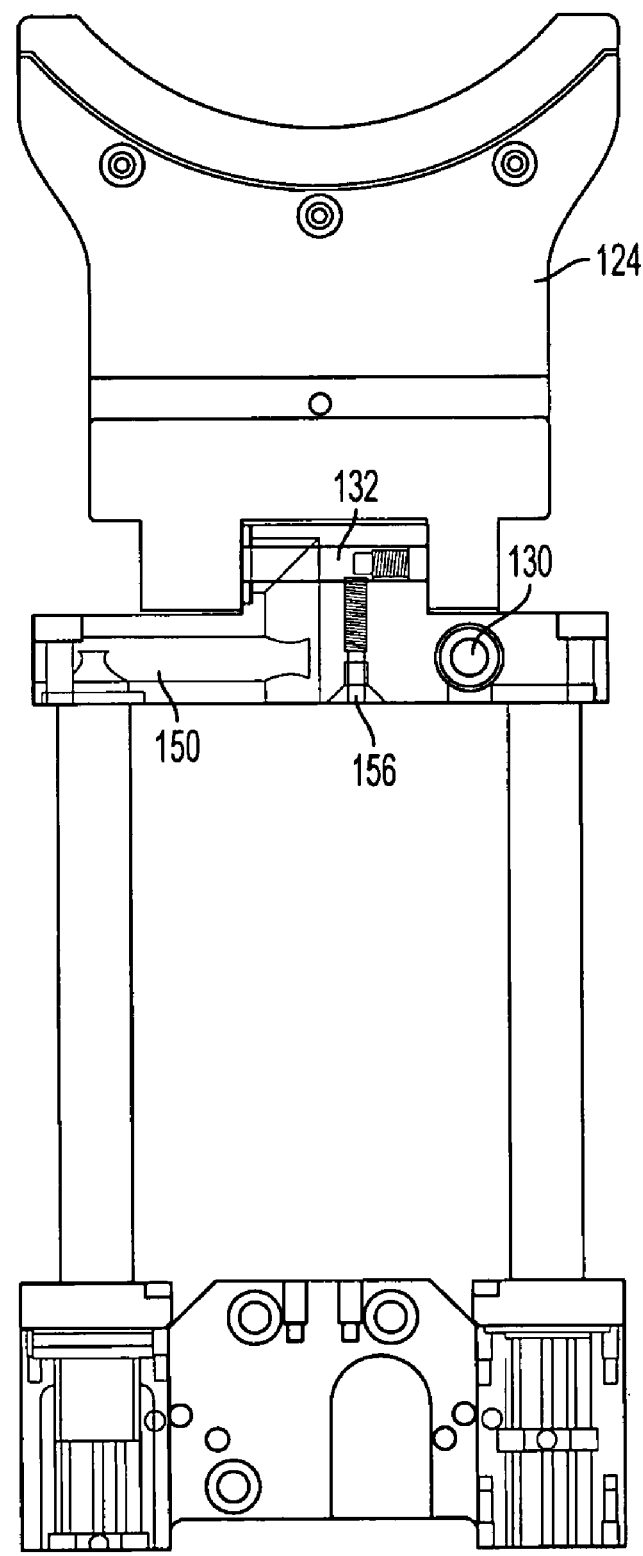
FIGS. 12A and 12B provide further details on the gimbaled paddle support configuration in accordance with one embodiment of the invention.
Figure 12B:
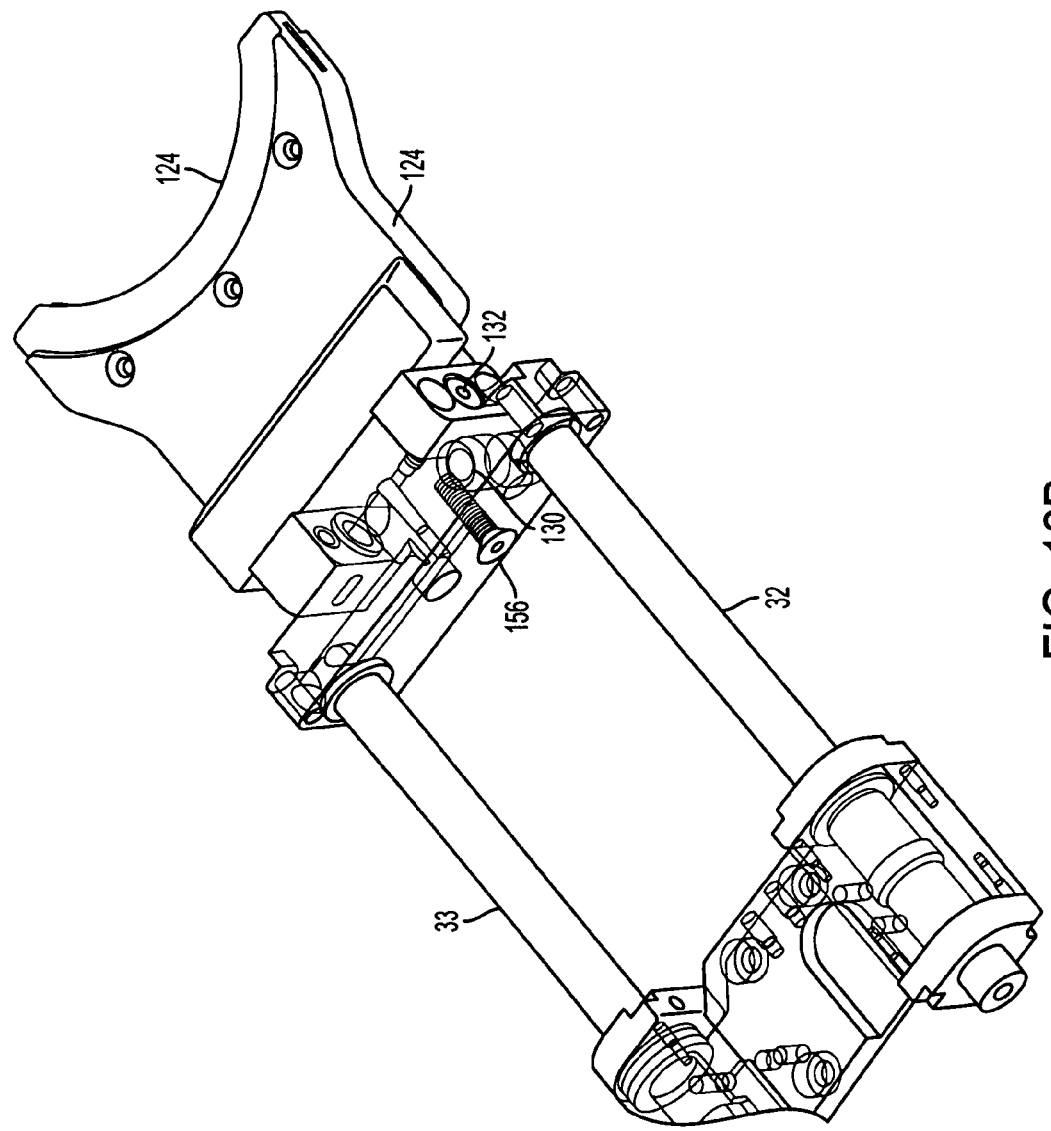

FIGS. 12A and 12B provide further details on the gimbaled paddle support configuration in accordance with one embodiment of the invention. Disc paddle 124, which may be referred to as a disc support may pivot around multiple pivot points in one embodiment, such as pivot point 132 and the vacuum channel into disc paddle 124. In one embodiment, set screws are used to support a certain position for each of the pivot points. One skilled in the art will appreciate that alternative means may be used to lock a position in place and the set screws are not meant to be limiting. For example, set screw 156 may be used to enable movement around a shaft extending along pivot point 132, and then the adjacent locking screws to pivot point 132 may be used to lock the assembly in place once the set screw adjustment is made. Thus, loosening set screw 156 enables movement of disc paddle 124 around pivot point 132 and tightening set screw 156 locks the position of the paddle support. While various adjustment screws are illustrated in the embodiments, such as adjustment screw 130, the invention is not limited to these embodiments.

Any of the operations described herein that form part of the invention are useful machine operations. The invention also relates to a device or an apparatus for performing these operations. The apparatus can be specially constructed for the required purpose, or the apparatus can be a general-purpose computer selectively activated, implemented, or configured by a computer program stored in the computer. In particular, various general-purpose machines can be used with computer programs written in accordance with the teachings herein, or it may be more convenient to construct a more specialized apparatus to perform the required operations.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims. In the claims, elements and/or steps do not imply any particular order of operation, unless explicitly stated in the claims.

What is claimed is:

1. An apparatus for transporting a substrate, comprising:
   an upper portion housing an electric motor, the electric motor having a drive shaft;
   a motor housing, the motor housing enclosing the electric motor;
   a pivot bracket having a first end and a second end, the first end of the pivot bracket being coupled to the drive shaft;
   a lower portion having a top surface affixed to the second end of the pivot bracket, the lower portion including a plurality of paddle assemblies each having support extensions extending though a bearing assembly of the lower portion, each of the paddle assemblies having an independent drive assembly disposed between corresponding support extensions, wherein the independent drive assembly is a magnetically coupled drive, wherein the lower portion translates between a vertical and horizontal orientation by pivoting around an axis of the driveshaft.

2. The apparatus of claim 1, wherein the electric motor is one of a servo actuator or a stepper motor.

3. The apparatus of claim 1, wherein each of the paddle assemblies includes a disc paddle configured to support a portion of a perimeter of the substrate.

4. The apparatus of claim 3, wherein the disc paddle supports the substrate through suction.

5. The apparatus of claim 1, wherein each of the support extensions are hollow and at least one of the corresponding support extensions enables access for an external vacuum source to a disc paddle disposed on an end of one of the paddle assemblies for supporting a portion of a perimeter of a magnetic disc.

6. The apparatus of claim 1, wherein the independent drive assembly is rod-less.

7. The apparatus of claim 1, wherein the bearing assembly includes a pair of bearings for each of the support extensions.

8. An end effector for transporting substrates, comprising;
   a fixed upper portion housing an electric motor driving a pivotable lower portion, the pivotable lower portion affixed to the fixed upper portion, the pivotable lower portion having first and second paddle assemblies extending from a bearing assembly, the first and second paddle assemblies being driven through corresponding magnetically coupled drive shafts, an outer surface of the bearing assembly having a shock absorbing mechanism that reduces travel speed of corresponding paddle assemblies as the paddle assemblies approach a travel end point, the magnetically coupled drive shafts linked to corresponding support extensions of the first and second paddle assemblies through a compliant bracket, each of the corresponding support extensions being hollow and delivering vacuum from an external source to disc paddles of the corresponding paddle assemblies.

9. The end effector of claim 8, wherein the pivotable lower portion pivots over a 90 degree range of travel.

10. The end effector of claim 8, wherein a vacuum conduit delivers vacuum from the fixed upper portion to an area enclosed by a housing of the pivotable lower portion.

11. The end effector of claim 8, wherein the magnetically coupled drive shaft includes a first magnet disposed within a tube and a second magnet mating with the first magnet through a wall of the tube.

12. The end effector of claim 11 wherein the first magnet and the second magnet are configured as a plurality of cylindrical sections.

13. The end effector of claim 8, wherein each the disc paddles can pivot around multiple pivot points.

14. The end effector of claim 8, wherein each of the disc paddles pivots around a vacuum channel within the disc paddle.

15. An apparatus for transporting a substrate, comprising:
   a first portion housing an electric motor, the electric motor having a drive shaft;
   a pivot bracket having a first end and a second end, the first end of the pivot bracket being coupled to the drive shaft; and
   a second portion affixed to the second end of the pivot bracket, the second portion including a plurality of paddle assemblies each having support extensions extending through a bearing assembly housed within the second portion, each of the paddle assemblies having an independent magnetically coupled drive assembly disposed between corresponding support extensions, each magnetically coupled drive having a shaft with an external drive body disposed around a portion of the shaft and an internal drive body disposed within an inner cavity of the shaft, the external drive body and the internal drive body including magnets coupling the internal and the external drive bodies in that movement of the internal drive body within the inner cavity causes movement of the external drive body.

16. The apparatus of claim 15, wherein one of the support extensions provide vacuum to a paddle support affixed to one end of the paddle assembly and wherein the internal drive body is pneumatically driven.

17. The apparatus of claim 16, wherein the paddle support is pivotable around a vacuum channel defined within the paddle support.

18. The apparatus of claim 15, wherein the external drive body decouples from the internal drive body when the paddle assembly encounters resistance during extension and retraction operations.

19. The apparatus of claim 18, wherein the apparatus includes sensors configured to detect retraction and extension cycles of the support extensions and wherein the sensors trigger an error condition when one of the retraction and extension cycles exceed a time limit.

20. The apparatus of claim 15, wherein the second portion is pivotable around an axis of the drive shaft.

* * * * *